US005122906A

United States Patent [19]

Wheatley

[11] Patent Number: 5,122,906

[45] Date of Patent: * Jun. 16, 1992

[54] THICK/VERY THIN MULTILAYER REFLECTIVE POLYMERIC BODY

[75] Inventor: John A. Wheatley, Midland, Mich.

[73] Assignee: The Dow Chemical Company, Midland, Mich.

[*] Notice: The portion of the term of this patent subsequent to Jun. 16, 2009 has been disclaimed.

[21] Appl. No.: 466,168

[22] Filed: Jan. 17, 1990

Related U.S. Application Data

[63] Continuation-in-part of Ser. No. 368,695, Jun. 20, 1989, abandoned.

[51] Int. Cl.[5] ..................... G02B 5/28; G02B 5/30; B32B 7/02

[52] U.S. Cl. .............................. 359/586; 359/500; 359/589; 428/213

[58] Field of Search ......................... 350/163-167; 425/133.5; 428/220, 212-215, 423.3-423.7, 474.4-480; 356/71; 359/577, 884, 580-590, 483-502

[56] References Cited

U.S. PATENT DOCUMENTS

| | | | |
|---|---|---|---|
| 3,711,176 | 1/1973 | Alfrey, Jr. et al. | 350/166 |
| 3,759,647 | 9/1973 | Schrenk | 425/133.5 |
| 3,773,882 | 11/1973 | Schrenk | 264/171 |
| 3,884,606 | 5/1975 | Schrenk | 425/133.5 |
| 4,309,075 | 1/1982 | Apfel et al. | 350/164 |
| 4,310,584 | 1/1982 | Cooper et al. | 428/212 |
| 4,540,623 | 9/1985 | Im et al. | 428/220 |
| 4,805,989 | 2/1989 | Nakajima | 350/164 |
| 4,937,134 | 6/1990 | Schrenk et al. | 350/163 |

OTHER PUBLICATIONS

Radford, et al, "Reflectivity of Iridescent Coextruded Multilayered Plastic Films," *Polymer Engineering and Science*, May 1973, vol. 13, No. 3.

*Primary Examiner*—Bruce Y. Arnold
*Assistant Examiner*—Thong Nguyen

[57] ABSTRACT

A multilayered reflective body which is thermoformable and capable of being fabricated into films, sheets, and a variety of parts while maintaining a uniform reflective appearance is provided. The reflective polymeric body includes at least first and second diverse polymeric materials of a sufficient number of alternating layers of the first and second polymeric materials such that at least 30% of the light incident on the body is reflected. A substantial majority of the individual layers of the body have an optical thickness of not more than 0.09 micrometers or not less than 0.45 micrometers, with at least one of the individual layers having an optical thickness of not more than 0.09 micrometers, and adjacent layers of the first and second polymeric materials differ from each other in refractive index by at least about 0.03.

33 Claims, 3 Drawing Sheets

THICK/VERY THIN MULTILAYER REFLECTIVE POLYMERIC BODY

CROSS-REFERENCE TO RELATED APPLICATION

This application is a continuation-in-part of U.S. application Ser. No. 07/368,695, filed Jun. 20, 1989 now abandoned.

BACKGROUND OF THE INVENTION

The present invention relates to a multilayered polymeric body of alternating optically thick and very thin layers, which reflects light and which can be fabricated to have a silvery or hued (i.e., gold, copper, etc.) metallic or nonconventional hued (i.e., blue, green) appearance, and to articles produced therefrom which may find use as mirrors, reflectors, lenses, polarizers, and the like.

Conventional methods for fabricating reflective surfaces include forming such surfaces of highly polished metals. Because of the high costs and fabricating problems involved in using metals, more recently fabricators have used plastic surfaces which contain thin coatings of metal thereon. Thus, metal coated plastic articles are now commonly found as both decorative and functional items in a number of industries. Such articles are used as bright work for consumer appliances such as refrigerators, dishwashers, washers, dryers, radios, and the like. These types of articles are also used by the automotive industry as head lamp reflectors, bezels, radio knobs, automotive trim, and the like.

Typically, such metal coated plastic articles are formed by electroplating or by the vacuum, vapor, or chemical deposition of a thin metal layer on the surface of the article. Additionally, such coatings are subject to the chipping and flaking of the metal coatings as well as corrosion of the metal over time. If additional protective layers must be applied over the metal coating to protect it, additional labor and materials costs are involved. Further, there may be environmental disposal problems with some metal deposition processes.

Multilayer articles of polymers are known, as are methods and apparatuses for making such articles. For example, such multilayered articles may be prepared utilizing multilayer coextrusion devices as described in commonly-assigned U.S. Pat. Nos. 3,773,882 and 3,884,606 to Schrenk. Such devices are capable of simultaneously extruding diverse thermoplastic polymeric materials in substantially uniform layer thicknesses. The number of layers may be multiplied by the use of a device as described in commonly-assigned U.S. Pat. No. 3,759,647 to Schrenk et al.

Im et al, U.S. Pat. No. 4,540,623, teach a multilayer laminated article which includes a polycarbonate as one of the alternating layers. The articles of Im et al, however, are intended to be transparent rather than reflective and to exhibit optical properties comparable to a pure polycarbonate polymer.

Alfrey, Jr. et al, U.S. Pat. No. 3,711,176, teach a multilayered highly reflective thermoplastic body fabricated using thin film techniques. That is, the reflective thin film layers of Alfrey, Jr. et al relied on the constructive interference of light to produce reflected visible, ultraviolet, or infrared portions of the electromagnetic spectrum. Such reflective thin films have found use in decorative items because of the iridescent reflective qualities of the film.

However, the films of Alfrey, Jr. et al are extremely sensitive to thickness changes, and it is characteristic of such films to exhibit streaks and spots of nonuniform color. Further, color reflected by such films is dependent on the angle of incidence of light impinging on the film. Thus, such films are not practical for uses which require uniformity of reflectivity. Moreover, such films are not practical to thermoform into articles as localized thinning of the layers during thermoforming causes alterations in the reflective characteristics of the films.

Accordingly, there remains a need in the art for a polymeric reflective film, sheet or body which can be fabricated into a variety of parts without alteration of the uniform reflective appearance of the material over a range of processing conditions and part geometry. Further, there is a need for a reflective polymeric sheet or body which can be post formed without alteration of the uniform reflective appearance of the material. Still further, there is a need for silvery or metallic appearing articles which do not use metal.

SUMMARY OF THE INVENTION

The present invention meets those needs by providing a multilayered polymeric reflective body which is post formable and capable of being fabricated into films, sheets, and a variety of parts while maintaining a uniform highly reflective appearance. The body comprises alternating layers which differ in refractive index and which are either optically thick or optically very thin. While the alternating layers must differ in refractive index, the optically thick and optically very thin layers can be arranged in any order. That is, while a preferred embodiment of the invention utilizes alternating optically thick and very thin layers, the arrangement of thick and very thin layers may be varied as desired. However, at least one of the individual layers in the reflective body should be an optically very thin layer. The optically thick layers are too thick to cause visible iridescent effects (visually perceived as a variety of colors), while the very thin layers are too thin to cause such effects. The resulting multilayered polymeric body reflects substantially white light and exhibits a silvery, metallic appearance.

The terms "reflective", "reflectivity", "reflection", and "reflectance" as used herein refer to total reflectance (i.e., ratio of reflected wave energy to incident wave energy) sufficiently specular in nature such that the polymeric body has a metallic appearance. The use of these terms is intended to encompass semi-specular or diffuse reflection such as that of brushed metal, pewter, and the like. In general, reflectance measurement refers to reflectance of light rays into an emergent cone with a vertex angle of 15 degrees centered around the specular angle.

A specific intensity of reflectance, when used herein, is the intensity of reflection which occurs at a wavelength where negligible absorption occurs. For example, a silver appearing article reflects substantially all visible wavelengths, whereas the introduction of a dye to achieve other metallic hues will necessarily lower reflectivity of the body at the absorbing wavelengths. Wavelengths unaffected by the dye will be reflected at essentially the same intensity as a non-dyed sample, and it is at these unaffected wavelengths to which the intensity of reflection is referring.

According to one aspect of the present invention, a reflective polymeric body of at least first and second diverse polymeric materials is provided, the body comprising a sufficient number of alternating layers of the first and second polymeric materials such that at least 30% of light incident on the body is reflected. As used herein, the term "light" is meant to encompass not only visible light but also electromagnetic radiation in both the infrared and ultraviolet regions of the spectrum. The term "at least 30% of light incident on the body" refers, as discussed above, to reflected light at wavelengths where negligible absorption occurs.

A substantial majority of the individual layers of the body have an optical thickness of not more than 0.09 micrometers or not less than 0.45 micrometers. At least one of the individual layers has an optical thickness of not more than 0.09 micrometers. Preferably, at least 75% of the individual layers have at least an optical thickness of 0.45 micrometers or greater or 0.09 micrometers or less. Alternatively, the individual layers should have an optical thickness such that no visibly perceived iridescence is reflected from the body. The first and second polymeric materials differ from each other in refractive index by at least about 0.03.

A number of substantially transparent polymers are suitable for use in the present invention. In a preferred embodiment of the invention, the first polymeric material is polycarbonate or rigid or flexible polyurethane and the second polymeric material is polymethyl methacrylate or polyether amide. The polymeric body may also comprise three or more alternating layers of diverse polymeric materials. In one embodiment using a three layer pattern of repeating units ABCBA, the first (A) polymeric material is polystyrene, the second (B) material is a styrene-hydroxy ethylacrylate copolymer, and the third (C) polymeric material is polymethyl methacrylate. Alternatively, the first and third materials may be the same, and the second (B) material may be a copolymer of styrene and methyl-methacrylate.

For some three layer combinations, the B layer may not only contribute to the reflective properties of the body but may also act as an adhesive layer to bond the A and C layers in the multilayer body. It is not necessary that the refractive index mismatch of the B layer with the other two layers be at least about 0.03. For example, the refractive index of the polymer making up the B layer may be intermediate that of the A and C layers.

Other three layer repeating patterns are also possible. For example, an ABCABC repeating pattern may be used where the polymer making up the third polymer layer may be placed in the multilayer body as a moisture or oxygen barrier layer or toughening layer. When the third polymer layer is a barrier layer, it may be present as a single layer on one or both exterior surfaces of the body or as an interior layer. For example, suitable barrier layer materials such as copolymers of ethylene and vinyl alcohol, polyvinylidene chloride, nitrile polymers, and nylons may be used in or on the multilayer body. Suitable adhesive materials such as maleic anhydride grafted polyolefins may be used to bond such barrier layer materials to the multilayer body.

Also, the third polymer layer may be found as a surface or skin layer on one or both major exterior surfaces for an ABABAB repeating body or as an interior layer. The skin layer may be sacrificial, or may be permanent and serve as a scratch resistant or weatherable protective layer. Further, such skin layers may be post applied to the body after coextrusion. For example, a skin layer may be applied as a sprayed on coating which would act to level the surface of the body to improve optical properties and impart scratch resistance, chemical resistance and/or weatherability. The skin layer may also be laminated to the multilayered body. Lamination is desirable for those polymers which are not readily coextrudable.

In a preferred form, the polymeric body is coextruded and every other layer in the two layer ABABAB repeating body is a thick optical layer of 0.45 micrometers or greater while the other layer is a very thin optical layer of 0.09 micrometers or less. For a polymeric body having ABCBA repeating layers, either one or two of the three layers may be thick, with the other layers being very thin optical layers.

In certain embodiments of the invention, it is desirable to form the reflective polymeric body to comprise at least 500 or more layers. Increasing the number of layers in the polymeric body has been found to increase its reflectivity (i.e., the percentage of incident light reflected from the body). Thus, by controlling the number of layers, the degree of reflectivity of the article may be controlled.

In some embodiments of the invention it may be desirable to incorporate coloring agents such as dyes or pigments into one or more of the individual interior layers of the polymeric body or into one or both of the outer skin layers of the body. This can be done to one or both of the outer or skin layers of the body, or alternatively, the coloring agent may be incorporated into one or more interior layers in the body. The coloring agents may be selected to give the polymeric body a metallic appearance other than its normal silvery appearance such as bronze, copper, or gold, for example.

Different colors such as black, blue, red, yellow, white, and the like may also be used. Typically, it is most desirable to use pigmented coloring agents in the interior layers to provide opaqueness and a two-sided mirror-like reflective quality and to use dyes on exterior surface layers. Coloring agents may be used in combination to provide desirable coloring and optical properties. For example, a pigmented white coloring agent may be used in an interior surface while a colored dye, such as blue, yellow, red, or green may be included on one or more surface layers to provide a unique reflective colored effect.

Further, while the normal surface of the body is smooth to give a highly reflective silver appearance, in some instances it may be desirable to give the surface of the body a roughened or brushed appearance to simulate a brushed metallic appearance. Further, a solvent may be used to etch the surface of the multilayer body to provide a matte or pewter look to the body. Additionally, the body may be embossed with a variety of patterns to provide desirable optical effects.

The reflective polymeric body of the present invention may find several applications. In another embodiment of the invention, the reflective body may be fabricated as a mirror-like polymeric article having at least first and second major surfaces, the article comprising a sufficient number of alternating layers of first and second polymeric materials such that at least 30% of the light incident on the article is reflected. A substantial majority of the individual layers of the article have an optical thickness of not more than 0.09 micrometers or not less than 0.45 micrometers, with at least one of the individual layers having an optical thickness of not more than 0.09 micrometers, while the first and second polymeric materials differ from each other in refractive index by at least about 0.03.

To provide the mirror like quality to the article, one of the major surfaces includes a light absorbent layer, such as a layer of a black or other colored pigment. The light absorbent layer may be coextruded or applied as a lacquer or paint. Alternatively, increasing the number of individual layers to above 500 or more results in increased reflectance of incident light from the article resulting in a mirror-like quality in the article.

The reflective polymeric body of the present invention may also be fabricated to appear mirror-like on all major surfaces by coextruding a light absorbing layer in the interior of the article. Thus, a mirror-like polymeric article is provided which has at least first and second major surfaces, with the article comprising a sufficient number of alternating layers of first and second polymeric materials such that at least 30% of light incident on the article is reflected and at least one interior light absorbing layer. A substantial majority of the individual layers of the article have an optical thickness of not more than 0.09 micrometers or not less than 0.45 micrometers, with at least one of the individual layers having an optical thickness of not more than 0.09 micrometers, while the first and second polymeric materials differ from each other in refractive index by at least about 0.03.

The reflective polymeric body of the present invention may also be fabricated to act as a birefringent light polarizer which polarizes a broad band of the electromagnetic spectrum. The polarizer is fabricated of at least first and second diverse polymeric materials, with the polarizer comprising a sufficient number of alternating layers of the first and second polymeric materials such that at least 30% of light incident on the polarizer in the plane of polarization is reflected in the plane of polarization. A substantial majority of the individual layers of the polarizer have an optical thickness of not more than 0.09 micrometers or not less than 0.45 micrometers, with at least one of the individual layers having an optical thickness of not more than 0.09 micrometers, and with the first and second polymeric materials differing from each other in refractive index by at least about 0.03 in one plane of the polarizer. In a preferred embodiment, the difference in refractive index between the first and second polymeric materials is caused by selecting polymers having differing stress optical coefficients and then stretching those materials in a uniaxial direction to orient the polymeric materials.

Because very thin optical layers can be used for some of the layers in the multilayer body, reflective films having overall thicknesses of 0.01 inches or less may be fabricated. Further, the use of very thin optical layers results in reflected images which are sharper and better focused than possible using only thick optical films. Additionally, the use of very thin optical layers permits the fabrication of a body using up to 80% or more by volume of one polymer (the thicker layers) with less than 20% by volume of a second polymer (the thinner layers). This results in a very strong laminate structure which approximates the physical properties of the single polymer.

Finally, the use of the combination of thick and very thin optical layers results in a laminate which does not whiten or appear to craze when impacted. For example, in a typical thick ductile/very thin brittle combination such as polycarbonate/polymethyl methacrylate, a multilayer stack of all optically thick layers will whiten under light impact. The thick/very thin combination of layers of the present invention do not exhibit crazing (although some crazing may occur, it is not visible to the eye) or whitening when impacted.

Additionally, the multilayer reflective polymeric bodies of the present invention may be formed into a number of decorative and/or structural parts. The bodies may be formed by coextrusion techniques initially into sheets which may then be post formed. Such post forming operations may include thermoforming, vacuum forming, or pressure forming. Further, through the use of forming dies, the multilayer reflective body may be initially formed into a variety of useful shapes including profiles, tubes, parisons which can then be formed into blow-molded containers, and the like.

Accordingly, it is an object of the present invention to provide a reflective polymeric body which can be fabricated into films, sheets, and a variety of parts, is post formable, and which has a uniformly reflective appearance. This, and other objects and advantages of the invention will become apparent from the following detailed description the accompanying drawing and the appended claims.

DETAILED DESCRIPTION OF THE PREFERRED EMBODIMENTS

Figure 1:
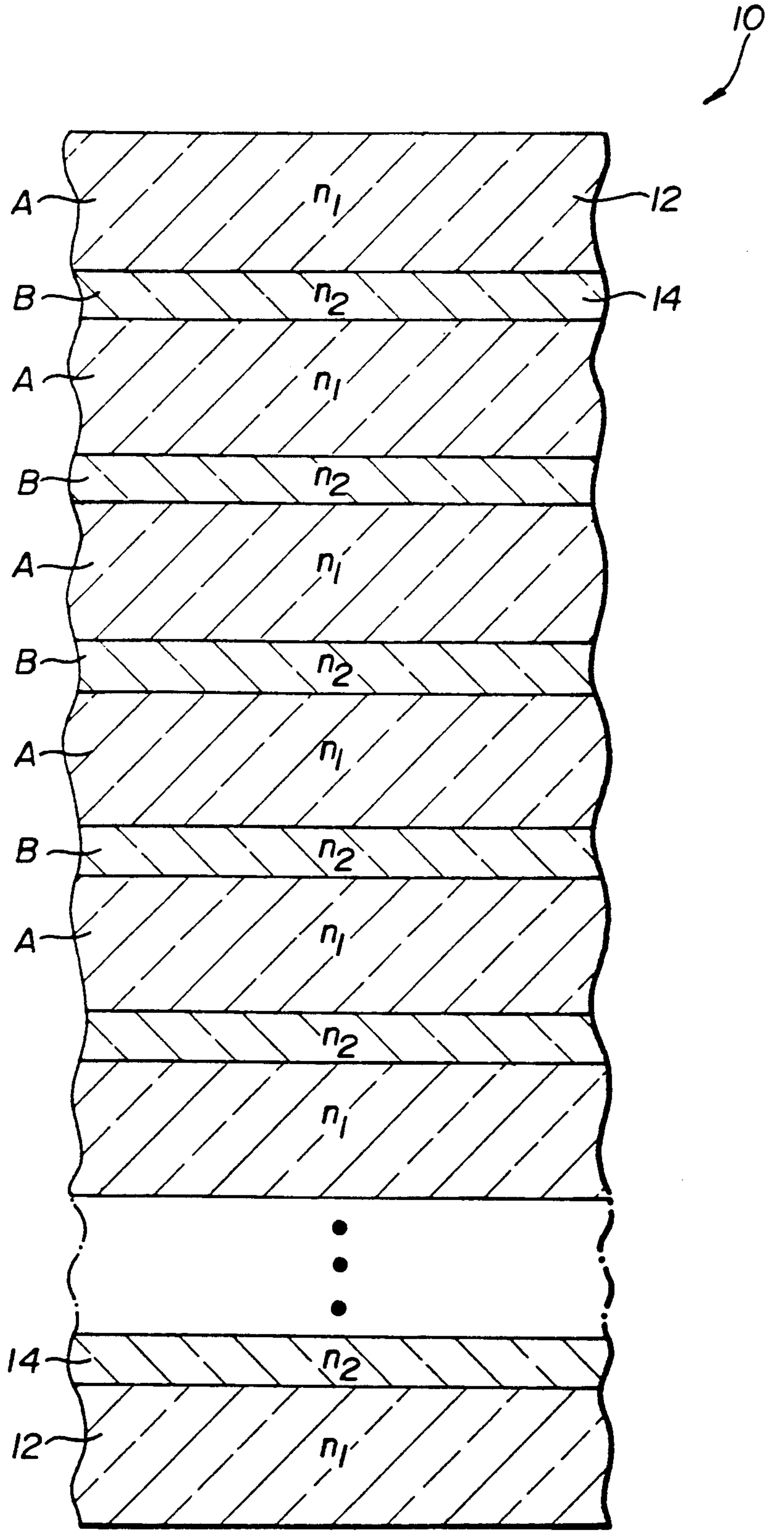
FIG. 1 is a schematic cross-section of a two component multilayer polymeric reflective body of the present invention, where the first polymer, A, has a refractive index, $n_1$, and the second polymer, B, has a refractive index, $n_2$.

The present invention provides a highly reflective multilayer polymeric body made up of from a hundred to several thousand alternating thick and very thin layers of polymers which differ from each other in refractive index. A substantial majority of the individual layers of the polymeric materials have an optical thickness of not more than 0.09 micrometers or not less than 0.45 micrometers, where the optical thickness is defined as the product of the individual layer thickness times the refractive index of the polymeric material which makes up that layer. Preferably, the individual layers which make up the multilayer body are substantially continuous.

Thus, in its preferred form, the multilayer reflective polymeric body of the present invention is made up of multiple alternating optically thick and very thin layers, as opposed to the multilayer "thin film" articles of the prior art. For purposes of optical properties, i.e., reflectance and transmittance, a thin film can be described as a film thinner than one wavelength of light at which the film will be applied. Thus, for films to be used in the visible wavelength band, a thin film is described in the literature as one whose thickness, D, is less than about 0.5 micrometer or whose optical thickness, ND (where N is the refractive index of the material) is less than about 0.7 micrometers. Vasicek, *Optics of Thin Films* (1960) at pages 100 and 139.

Prior art thin film layer articles describe interference films which rely on the constructive optical interference of light to produce intense reflected coherent light in the visible, ultraviolet, or infrared portions of the electromagnetic spectrum according to the equation:

$$\lambda_m = (2/m)(N_1D_1 + N_2D_2),$$

where $\lambda_m$ is the reflected wavelength in nanometers, $N_1$ and $N_2$ are the refractive indices of the alternating polymers, $D_1$ and $D_2$ are the thickness of the respective layers of polymers in nanometers, and m is the order of reflection (m=1,2,3, . . . ). Each solution of the equation determines a wavelength at which an intense reflection, relative to surrounding regions, is expected. The intensity of the reflection is a function of the "f-ratio" where, $$f = N_1D_1/(N_1D_1 + N_2D_2)$$

By proper selection of the f-ratio, one can exercise some degree of control over the intensity of reflection of the various higher order reflections. For example, first order visible reflections of blue (0.38 micrometer wavelength) to red (0.68 micrometer wavelength) can be obtained with layer optical thicknesses between about 0.075-0.25 micrometers. Iridescent films may also be designed to reflect visible light at higher order reflectances, although at lower intensities.

As can be seen, such thin film polymeric bodies are strongly dependent upon film (and individual layer) thickness to determine reflected wavelength. Such thin films are extremely sensitive to thickness changes, and it is characteristic of such thin films to exhibit nonuniform streaks and spots of color.

The multilayer bodies of the present invention do not display the vivid iridescence which is displayed in prior art colorful iridescent films. In fact, it is an important object of this invention specifically to avoid layer thicknesses which result in substantial iridescent color. Alternating layers too thick to cause iridescence, in combination with layers too thin to cause iridescence, result in a reflection which is essentially silver and non-iridescent. This silvery appearance is due to higher order reflections from the thick layers being so closely spaced that the human eye perceives the reflection to be essentially non-iridescent.

The optical thickness range which is avoided by the present invention is $$\lambda/4 < nd < 5\lambda/4$$

where, $\lambda$=approximately 0.38 micrometers, n=refractive index of the polymer, and d=physical thickness of the layer in micrometers. Thus, in the practice of the present invention, the substantial majority of the thick layers have an optical thickness (nd) of greater than 5 $\lambda/4$, while the substantial majority of the very thin layers have an optical thickness of less than $\lambda/4$.

Articles made in accordance with the present invention exhibit a uniform silvery reflective appearance, not the multicolored, iridescent appearance common to prior art thin film multilayer articles. Rather, the reflective characteristics of the multilayer bodies of the present invention are governed by the following equation:

$$R = (kr)/(1 + (k-1)r) \times 100,$$

where R is the amount of reflected light (%), k is the number of thick film layers, and $r = [(N_1 - N_2)/(N_1 + N_2)]^2$. See Vasicek, *Optics of Thin Films* (1960) at pages 69-70.

This equation indicates that the intensity of the reflected light, R, is a function only of r and k, where r and k are defined as above. As a close approximation, R is a function only of the refractive index mismatch of the two polymer components and the total number of layer interfaces. This relationship contrasts greatly with that of prior thin film articles whose reflectivity is highly sensitive to layer thickness and angle of view.

Thus, the reflected wavelength of light from the multilayer polymeric body of the present invention is independent of both individual layer and total structure thickness over a wide processing range so long as a substantial majority of the individual layers has an optical thickness equal to or greater than about 0.45 micrometers or equal to or less than about 0.09 micrometers. Uniformity of reflection is inherent in the design of the body. Moreover, a gradient of layer thickness through the thickness of the body is neither detrimental nor advantageous to the appearance of the body as long as a substantial majority of the individual layers of the polymers maintains an optical thickness equal to or greater than about 0.45 micrometers or equal to or less than 0.09 micrometers. This again contrasts with prior thin film articles which reflect broad or narrow bandwidths depending upon layer thickness gradient.

Thus, it is not necessary for all of the layers in the reflective polymeric bodies of the present invention to have optical thicknesses of 0.45 micrometers or greater or 0.09 micrometers or less. The preferred coextrusion process for fabricating the polymeric bodies of the present invention may introduce layer thickness variations both through the thickness of the body and in the plane of individual layers. Variation in layer thicknesses of each polymeric component can be as much as 300% or more. However, useful reflective bodies and articles may be made even with such wide variations as long as a substantial majority of the layers have an optical thickness of not more than 0.09 micrometers or not less than 0.45 micrometers. With this condition met, there is an absence of visibly perceived interference colors reflected from bodies and articles of the present invention.

The absence of the iridescent interference colors which characterize prior art thin films is somewhat subjective to the human eye. However, we have found that about 75% of the layers in the body must have optical thicknesses greater than 0.45 micrometers or less than 0.09 micrometers to obtain the broad band, visually uniform reflectance of substantially all wavelengths (white light) which characterizes the present invention. A minority of about 25% or fewer of the layers having optical thicknesses in the range of 0.1 to 0.45 micrometers have been found to have interference reflections of a sufficiently low intensity so that the body will have essentially no visibly perceived iridescence.

Figures 2A, 2B:
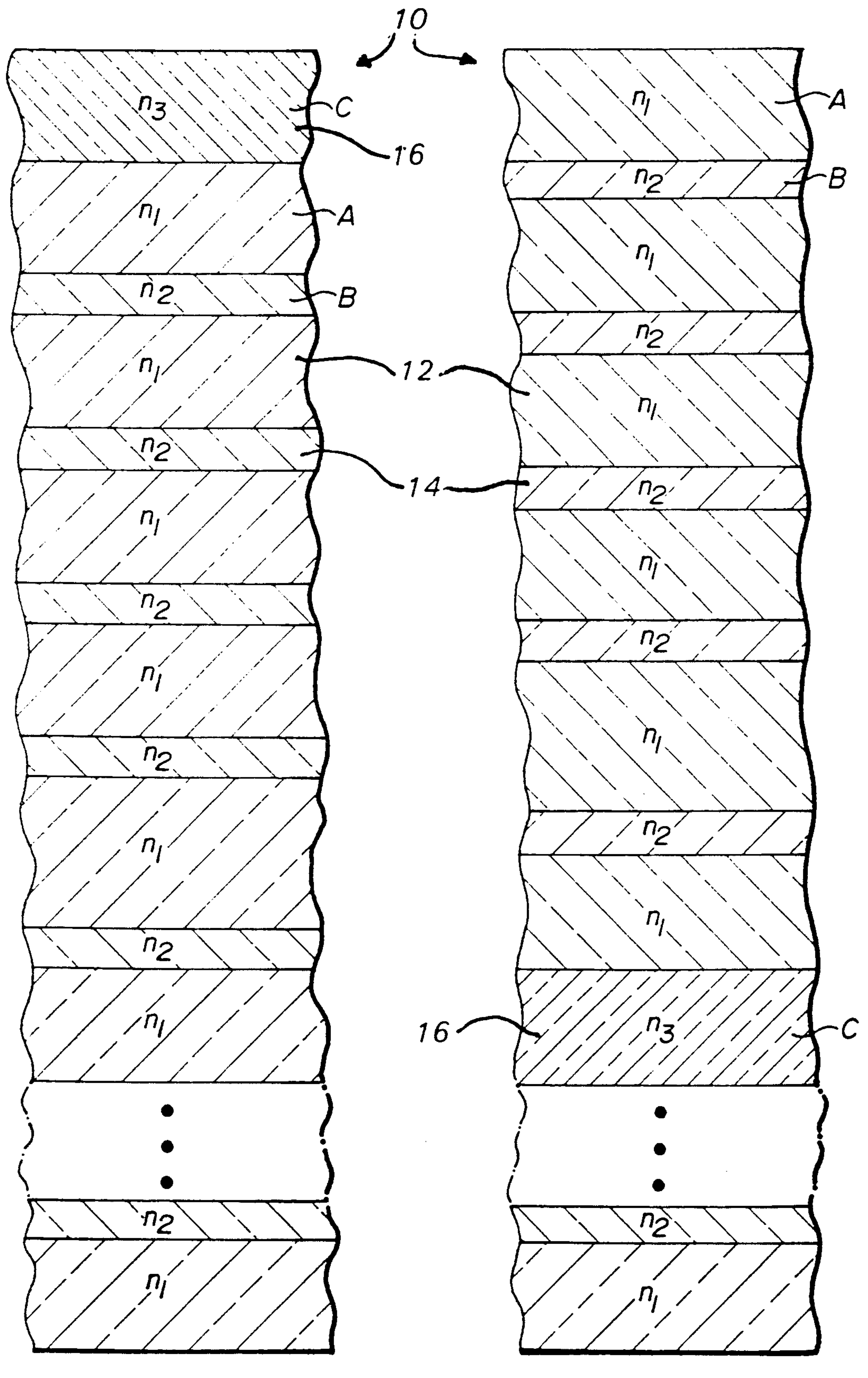
FIG. 2A is also a schematic cross-section of a two component multilayer polymeric reflective body and includes a barrier layer polymer, C, having a refractive index, $n_3$, on one exterior surface thereof.
FIG. 2B is also a schematic cross-section of a two component multilayer polymeric reflective body and includes a barrier layer polymer, C, having a refractive index, $n_3$, as an interior layer.

A typical two component multilayer reflective polymer body in the form of a sheet 10 is shown schematically in FIG. 1. The body 10 includes alternating layers of first polymer (A) 12 having a refractive index, $n_1$, and a second polymer (B) 14 having a refractive index, $n_2$. FIG. 1 shows a preferred form of the invention where all of the layers of first polymer A have an optical thickness of not less than 0.45 micrometers and all of the layers of second polymer B have an optical thickness of not more than 0.09 micrometers. FIGS. 2A and 2B show the presence of a third polymer (C) 16 having a refractive index, $n_3$. In this instance, the polymer acts as a barrier layer. In FIG. 2A, the barrier layer is on an exterior surface of the reflective body. In FIG. 2B, the barrier layer is one of the interior layers of the reflective body.

Figure 3:
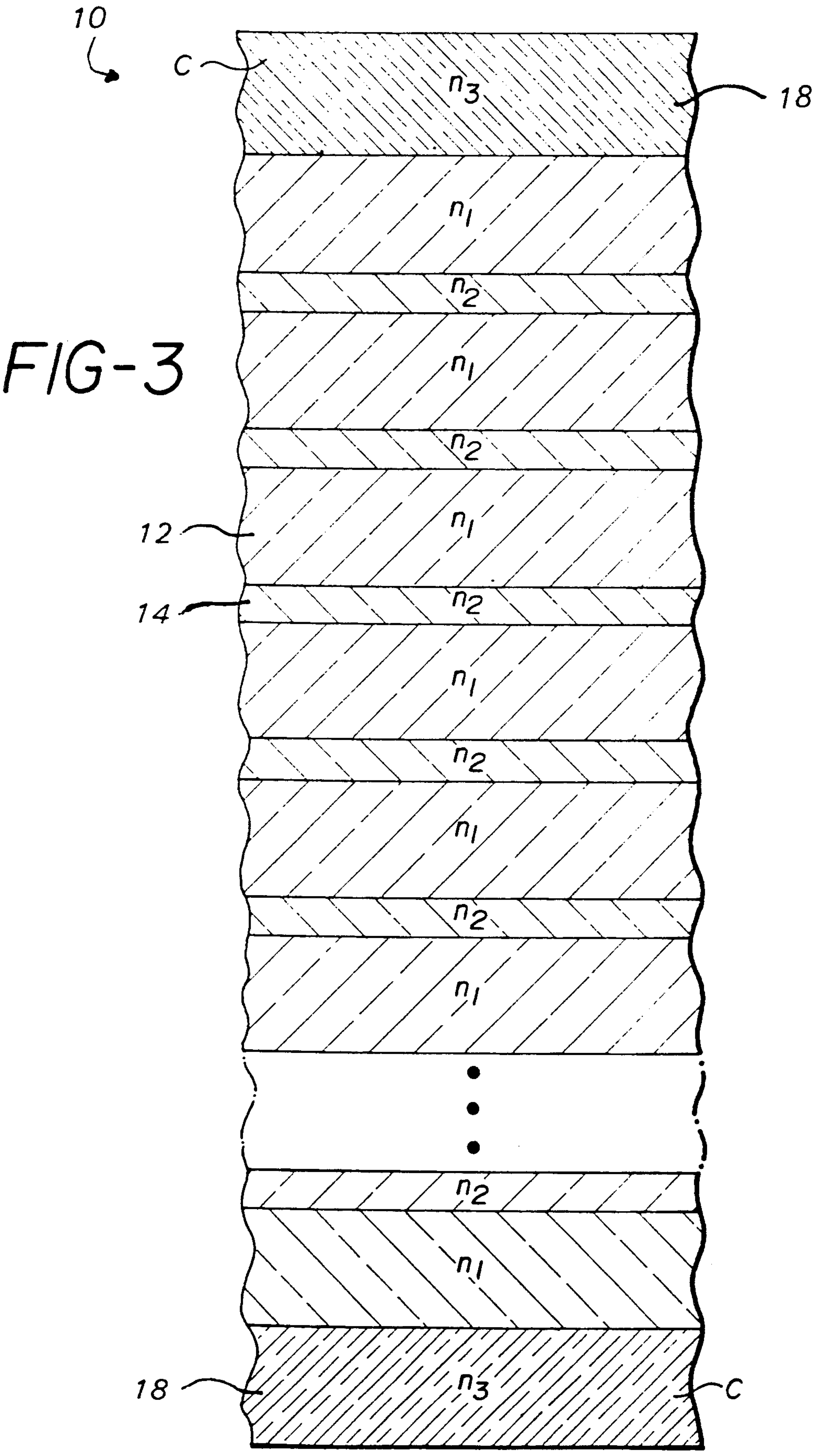
FIG. 3 is a schematic cross-section of a two component multilayer polymeric reflective body having protective skin layers of a polymer, C, having a refractive index, $n_3$, on both exterior surfaces thereof.

FIG. 3 illustrates yet another embodiment of the invention in which one or more protective skin layers are present on the reflective body. As shown in FIG. 3, skin layers of a polymer (C) 18 are positioned on both major exterior surfaces of the reflective body to protect the other layers from scratches or weathering.

The reflective polymeric bodies of the present invention become more highly reflective of incident light (i.e., transmit less light) as the number of layers is increased. Preferably, the number of layers is sufficient to produce an article which will reflect at least 30% of the incident light, for those wavelengths for which there is negligible absorption. Reflectances below about 30% are not sufficient to be readily observed. If it is desired to use the reflective polymeric body of the present invention as a mirror, adding additional layers will increase the reflectance of the body to 50% or higher to produce a silvery, mirror-like appearance.

The reflectivity of the bodies is also dependent upon the difference in refractive index between the two polymers used. That is, the greater the difference in refractive index, the greater the reflectivity of the body. Accordingly, it can be seen that the reflective nature of the polymeric bodies may be controlled by the selection of polymers having differing refractive indices and by fabricating the body to have additional layers.

The reflective multilayered polymeric bodies of the present invention may comprise alternating layers of a wide variety of generally transparent thermoplastic materials. Suitable thermoplastic resins, along with representative refractive indices, which may be used in the practice of the present invention include, but are not limited to: perfluoroalkoxy resins (refractive index = 1.35), polytetrafluoroethylene (1.35), fluorinated ethylene-propylene copolymers (1.34), silicone resins (1.41), polyvinylidene fluoride (1.42), polychlorotrifluoroethylene (1.42), epoxy resins (1.45), poly(butyl acrylate) (1.46), poly(4-methylpentene-1) (1.46, poly(vinyl acetate) (1.47), ethyl cellulose (1.47), polyformaldehyde (1.48), polyisobutyl methacrylate (1.48), polymethyl acrylate (1.48), polypropyl methacrylate (1.48), polyethyl methacrylate (1.48), polyether block amide (1.49), polymethyl methacrylate (1.49), cellulose acetate (1.49), cellulose propionate (1.49), cellulose acetate butyrate (1.49), cellulose nitrate (1.49), polyvinyl butyral (1.49), polypropylene (1.49), polybutylene (1.50), ionomeric resins such as Surlyn (trademark) (1.51), low density polyethylene (1.51), polyacrylonitrile (1.51), polyisobutylene (1.51), thermoplastic polyesters such as Ecdel (trademark) (1.52), natural rubber (1.52), perbunan (1.52), polybutadiene (1.52), nylon (1.53), polyacrylic imides (1.53), poly(vinyl chloro acetate) (1.54), polyvinyl chloride (1.54), high density polyethylene (1.54), copolymers of methyl methacrylate and styrene such as Zerlon (trademark) (1.54), transparent acrylonitrile-butadiene-styrene terpolymer (1.54), allyl diglycol resin (1.55), blends of polyvinylidene chloride and polyvinyl chloride such as Saran resins (trademark) (1.55), polyalpha-methyl styrene (1.56), styrene-butadiene latexes such as Dow 512-K (trademark) (1.56), polyurethane (1.56), neoprene (1.56), copolymers of styrene and acrylonitrile such as Tyril resin (trademark) (1.57), copolymers of styrene and butadiene (1.57), polycarbonate (1.59), other thermoplastic polyesters such as polyethylene terephthalate and polyethylene terephthalate glycol (1.60), polystyrene (1.60), polyimide (1.61), polyvinylidene chloride (1.61), polydichlorostyrene (1.62), polysulfone (1.63), polyether sulfone (1.65), and polyetherimide (1.66). The refractive indices reported above may vary somewhat at different wavelengths. For example, the refractive index of polycarbonate is somewhat greater for light in the blue region of the spectrum and somewhat lower for light in the red region of the spectrum.

Copolymers of the above resins are also useful such as hydrolyzed ethylene vinyl acetate, styrene and hydroxy ethylacrylate, styrene and maleic anhydride, styrene-butadiene block copolymers, styrene and methlymethacrylate, and styrene and acrylic acid. Other useful polymeric materials include polyetheretherketones, polybutene, maleic anhydride grafted polyolefins such as Admer (available from Mitsui Chemicals) and plexar (available from Quantum Chemicals), and copolymers of ethylene and vinyl acetate such as CXA (available from duPont). The latter three polymers are particularly useful as adhesive layers to bond other polymeric layers together in the multilayer construction.

A condition for the selection of the polymers to make up the alternating layers of the body is that the polymers selected have refractive indices which differ from each other by at least about 0.03. Further, the polymers should be compatible in processing temperatures so that they may be readily coextruded. The combination of thick and very thin layers makes it possible to fabricate polymeric bodies which contain up to 80% or more by volume of a first polymer (the thick layers) and 20% or less by volume of a second polymer (the very thin layers). This may result in a multilayer structure which has properties similar to the first polymer alone. Further, the resulting laminate may form a structure stronger than would be possible using a combination of alternating thick layers alone.

Multilayer bodies in accordance with the present invention are most advantageously prepared by employing a multilayered coextrusion device as described in U.S. Pat. Nos. 3,773,882 and 3,884,606 the disclosures of which are incorporated herein by reference. Such a device provides a method for preparing multilayered, simultaneously extruded thermoplastic materials, each of which are of a substantially uniform layer thickness, but with the layer thickness for each component layer being controllable. Preferably, a series of layer multiplying means as are described in U.S. Pat. No. 3,759,647 the disclosure of which is incorporated herein by reference may be employed.

The feedblock of the coextrusion device receives streams of the diverse thermoplastic polymeric materials from a source such as a heat plastifying extruder. The streams of resinous materials are passed to a mechanical manipulating section within the feedblock. This section serves to rearrange the original streams into a multilayered stream having the number of layers desired in the final body. Optionally, this multilayered stream may be subsequently passed through a series of layer multiplying means in order to further increase the number of layers in the final body.

The multilayered stream is then passed into an extrusion die which is so constructed and arranged that streamlined flow is maintained therein. Such an extrusion device is described in U.S. Pat. No. 3,557,265, the disclosure of which is incorporated by reference herein. The resultant product is extruded to form a multilayered body in which each layer is generally parallel to the major surface of adjacent layers. The use of alternating thick and very thin layers decreases the tendency of the layers to intermix.

The configuration of the extrusion die can vary and can be such as to reduce the thickness and dimensions of each of the layers The precise degree of reduction in thickness of the layers delivered from the mechanical orientinq section, the configuration of the die, and the amount of mechanical working of the body after extrusion are all factors which affect the thickness of the individual layers in the final body. It is necessary, however, that the optical thickness of a substantial majority of the individual layers of polymeric material be not more than 0.09 micrometers or not less than 0.45 micrometers.

Reflective polymeric bodies produced by the practice of the present invention may have a wide variety of potentially useful applications. For example, the bodies may be post formed into concave, convex, parabolic, half-silvered, etc. mirrors. If suitably flexible or rubbery polymers (elastomers) are utilized, the bodies may be bent or recoverably stretched into varying shapes. The mirror-like appearance may be accomplished by coextruding a black or otherwise light absorbing layer on one side of the body. Alternatively, one side of the final body may be coated with a colored paint or pigment to provide a highly reflective mirror-like body. Such mirrors would not be subject to breakage as would glass mirrors.

In some embodiments of the invention it may be desirable to incorporate coloring agents such as dyes or pigments into one or more of the individual layers of the polymeric body. This can be done to one or both of the outer or skin layers of the body, or alternatively, the coloring agent may be incorporated into one or more interior layers in the body. The coloring agents may be selected to give the polymeric body a metallic appearance other than its normal silvery appearance such as bronze, copper, or gold, for example.

Different colors such as black, blue, red, yellow, white, and the like may also be used. Typically, it is most desirable to use pigmented coloring agents in the interior layers to provide opaqueness and a mirror-like reflective quality and to use dyes on exterior surface layers. Coloring agents may be used in combination to provide desirable coloring and optical properties. For example, a pigmented white coloring agent may be used in an interior surface while a colored dye, such as blue, yellow, red, or green may be included on one or more surface layers to provide a unique reflective colored effect.

Further, while the normal surface of the body is smooth to give a highly reflective silver appearance, in some instances it may be desirable to give the surface of the body a roughened or brushed appearance to simulate a brushed metallic appearance. Further, a solvent may be used to etch the surface of the multilayer body to provide a matte or pewter look to the body. Additionally, the body may be embossed with a variety of patterns to provide desirable optical effects.

The reflective polymeric bodies may also be used as birefringent polarizers. Through proper selection of the polymeric materials making up the layers, a refractive index mismatch in one plane of the polarizer may be achieved. In a preferred method, the refractive index mismatch may be created after fabrication of the reflective polymeric body. The polymeric materials may be selected so that the first material has a positive stress optical coefficient and the second polymeric material has a negative stress optical coefficient. Stretching the body containing the two polymeric materials in a uniaxial direction causes them to orient and results in a refractive index mismatch in the plane of orientation to produce the polarizer. A broad band width of visible light passing through such bodies is polarized. This is in distinction to prior thin film multilayer polarizers which polarized only specific narrow wavelength ranges of light.

Additionally, the highly reflective polymeric bodies may be fabricated as non-corroding metallic appearing articles for indoor or outdoor exposure. For example, the polymeric bodies may be fabricated into signs, or bright work for appliances. The bodies may be post formed into highly reflective parts such as automotive head lamp reflectors, bezels, hub caps, radio knobs, automotive trim, or the like, by processes such as thermoforming, vacuum forming, shaping, rolling, or pressure forming. The bodies may also be formed into silvery or metallic appearing bathroom or kitchen fixtures which do not corrode or flake.

A number of different profiles may be coextruded in addition to sheets and films of the reflective polymeric materials. By profiles, we mean shaping of the multilayer body 1) in a forming die into sheets, channels, lenticular cross-sections, round or elliptical tubes, and parisons, or 2) outside of a die by a post forming procedure. For example, decorative moldings such as wall moldings and picture frame moldings, automotive trim, home siding, and the like may be readily coextruded through forming dies. Use of a tubular extrusion die produces a multilayered metallic appearing pipe. Such tubular dies may also be used to produce parisons which may then be blow molded into silvery appearing bottles and containers. Because the materials used in the construction of the body may be selected for given desired properties, the final body may be flexible or rubbery, producing an article which could be used as a variable focal length reflector by flexing the article to different degrees.

The reflective polymeric bodies of the present invention may also be post formed into a wide variety of items such as two-way mirrors, black bodies for insulation, and solar intensifiers to concentrate solar radiation. The bodies may also be formed into dinnerware, tableware, containers, and packages. By the proper selection of the polymers which were used, such articles may be made to be microwavable.

Further, because of the use of very thin layers, the polymers of the present invention may be formed into films having a total thickness of 0.01 inches or less. Such reflective films could be used in applications which would exclude thicker sheets such as for reflective tape for clothing, reflective window shades, and craft where the reflective film can be easily cut with scissors by the user.

The use of alternating thick and very thin optical layers also provides a much more focused and sharper reflection from the surface of the polymeric body. This is due to the fact that the light rays reflected from the multiple layers are closer together, resulting in a sharper image as perceived by the eye.

In order that the invention may be more readily understood, reference is made to the following examples, which are intended to be illustrative of the invention, but are not intended to be limiting in scope.

EXAMPLE 1

Employing an apparatus as generally described in U.S. Pat. Nos. 3,773,882 and 3,759,647, a sheet of a reflective polymeric body having alternating thick and very thin layers was prepared. The sheet had 657 alternating layers (ABABAB) of polycarbonate (Calibre 300-22, trademark of Dow Chemical Company) and polymethyl methacrylate (Cyro Acrylite H15-002, trademark of Cyro Industries) and two outer skin layers of the polycarbonate. The polycarbonate was used to form the optically thick layers and made up about 92.3% by weight of the sheet, while the polymethyl methacrylate was used to form the optically very thin layers and made up only about 7.7% by weight of the sheet.

A substantial majority of the optically thick polycarbonate layers in the final sheet had optical thicknesses of at least 0.45 micrometers, and a substantial majority of the optically very thin layers of polymethyl methacrylate had optical thicknesses of 0.09 micrometers or less. The refractive index of the polycarbonate (PC) was 1.586, while the refractive index of the polymethyl methacrylate (PMMA) was 1.49.

The polycarbonate and polymethyl methacrylate materials were heat plastified in extruders maintained at between about 500 and 520 degrees F. and fed to a feedblock from separate extruders. The polycarbonate was fed from two separate extruders at rates of 22.8 and 27.4 lb/hr, respectively, and the polymethyl methacrylate was fed from a third extruder at a rate of 4.2 lb/hr, to produce the multilayered core of the construction. Another extruder supplied outer skin layers of polycarbonate to the sheet at the rate of 11.5 lb/hr. The resulting sheet reflected substantially white light and appeared silvery; no iridescent color was observed.

EXAMPLE 2

Using the same apparatus as in Example 1, a reflective multilayer body having 657 alternating core layers of polycarbonate and polymethyl methacrylate and two outer skin layers of polycarbonate was coextruded. The polycarbonate was Calibre 200-22, trademark of Dow Chemical Company and the polymethyl methacrylate was Cyro Acrylite H15-002, trademark of Cyro Industries. The polycarbonate was used to form the optically thick layers and made up about 95.3% by weight of the sheet including cap layers, while the polymethyl methacrylate was used to form the optically very thin layers and made up only about 4.7% by weight of the sheet.

A substantial majority of the optically thick polycarbonate layers in the final sheet had optical thicknesses of at least 0.45 micrometers, and a substantial majority of the optically very thin layers of polymethyl methacrylate had optical thicknesses of 0.09 micrometers or less. The refractive index of the polycarbonate (PC) was 1.586, while the refractive index of the polymethyl methacrylate (PMMA) was 1.49.

The polycarbonate and polymethyl methacrylate materials were heat plastified in extruders maintained at between about 500 and 520 degrees F. and fed to a feedblock from separate extruders. The polycarbonate was fed from two separate extruders at rates of 40.0 lb/hr, and the polymethyl methacrylate was fed from a third extruder at a rate of 4.4 lb/hr, to produce the multilayered core of the construction. Another extruder supplied outer skin layers of polycarbonate to the sheet at the rate of 9.0 lb/hr. The resulting sheet reflected substantially white light and appeared silvery; no iridescent color was observed.

While certain representative embodiments and details have been shown for purposes of illustrating the invention, it will be apparent to those skilled in the art that various changes in the methods and apparatus disclosed herein may be made without departing from the scope of the invention, which is defined in the appended claims.

What is claimed is:

1. A reflective polymeric body of first and second diverse polymeric materials, the body comprising a sufficient number of alternating layers of said first and second polymeric materials such that at least 30% of light incident on said body is reflected, where the intensity of the reflected light is governed by the equation $R=(kr)/1+(k-1)r\times 100$, where R is the amount of reflected light (%), k is the number of thick and very thin film layers, and $r=((N_1-N_2)/(N_1+N_2))^2$, and $N_1$ and $N_2$ are the refractive indices of said polymeric materials at each layer interface, a substantial majority of the individual layers of said body having an optical thickness of not more than 0.09 micrometers or not less than 0.45 micrometers, with at least one of said individual layers having an optical thickness of not more than 0.09 micrometers, and wherein said first and second polymeric materials differ from each other in refractive index by at least about 0.03.

2. A reflective polymeric body of at least first and second diverse polymeric materials, the body comprising a sufficient number of alternating layers of said first and second polymeric materials such that at least 30% of light incident on said body is reflected, but such that essentially no visibly perceived iridescence is reflected, a substantial majority of the individual layers of said body having an optical thickness of not more than 0.09 micrometers or not less than 0.45 micrometers, with at least one of said individual layers having an optical thickness of not more than 0.09 micrometers, and wherein said first and second polymeric materials differ from each other in refractive index by at least about 0.03.

3. The reflective polymeric body of claim 2 in which said first polymeric material is polycarbonate and said second polymeric material is polymethyl methacrylate.

4. The reflective polymeric body of claim 2 in which said first polymeric material is a rigid polyurethane and said second polymeric material is polymethyl methacrylate.

5. The reflective polymeric body of claim 2 in which said first polymeric material is a flexible polyurethane and said second polymeric material is a polyether amide.

6. The reflective polymeric body of claim 2 in which said body comprises at least 500 layers.

7. The reflective polymeric body of claim 2 in which said polymeric body is thermoformable.

8. The reflective polymeric body of claim 2 including a coloring agent incorporated into at least one layer of said polymeric body.

9. The reflective polymeric body of claim 8 in which said coloring agent is selected from a group consisting of pigments and dyes.

10. The reflective polymeric body of claim 9 in which said coloring agent is incorporated into at least one surface layer of said polymeric body.

11. The reflective polymeric body of claim 9 in which said coloring agent is incorporated into at least one interior layer of said polymeric body.

12. The reflective polymeric body of claim 2 in which a least one surface layer has a brushed or roughened surface.

13. The reflective polymeric body of claim 2 in which at least one surface layer has been etched to provide a matte or pewter finish.

14. The reflective polymeric body of claim 2 in which at least one surface layer has been embossed.

15. The reflective polymeric body of claim 2 in which said first and second polymeric materials are elastomers.

16. The reflective polymeric body of claim 2 in which a substantial majority of the individual layers of said first polymeric material have an optical thickness of at least 0.45 micrometers and a substantial majority of the individual layers of said second polymeric material have an optical thickness of 0.09 micrometers or less.

17. The reflective polymeric body of claim 16 in which at least 75% of said individual layers of said first polymeric material have an optical thickness of at least 0.45 micrometers.

18. The reflective polymeric body of claim 16 in which at least 75% of said individual layers of said second polymeric material have an optical thickness of 0.09 micrometers or less.

19. The reflective polymeric body of claim 2 in which said body is extruded as a profile.

20. The reflective polymeric body of claim 19 in which said body is in the form of a tube.

21. The reflective polymeric body of claim 2 in which said body is post formed into a profile.

22. The reflective polymeric body of claim 2 in which said body is a blow-molded container.

23. The reflective polymeric body of claim 2 in which said polymeric body is in the form of a sheet having two major surface.

24. The reflective polymeric body of claim 23 in which said body includes a permanent protective skin layer on at least one major surface thereof.

25. The reflective polymeric body of claim 2 which includes a barrier layer as an exterior layer of said body.

26. The reflective polymeric body of claim 2 in which said polymeric body includes first, second, and third diverse polymeric materials of alternating layers in a pattern ABCBA.

27. The reflective polymeric body of claim 26 in which said first polymeric material is polystyrene, said second polymeric material is a styrene hydroxy ethylacrylate copolymer, and said third polymeric material is polymethyl methacrylate.

28. The reflective polymeric body of claim 2 which includes a barrier layer as an interior layer of said body.

29. A reflective polymeric film (k—least first and second diverse polymeric materials. the film comprising a sufficient number of alternating layers of said first and second polymeric materials such that at least 30% of light incident on said film is reflected. where the intensity of the reflected light is governed by the equation $R=(kr)/(1+(k-1)r)\times 100$, where R is the amount of reflected light (%). k is the number of thick and very thin film layers, and, $r=((N_1-N_2)/(N_1+N_2))^2$, and $N_1$ and $N_2$ are the refractive indices of said polymeric materials at each layer interface, a substantial majority of the individual layers of said film having an optical thickness of not more than 0.09 micrometers or not less than 0.45 micrometers, with at least one of said individual layers having an optical thickness of not more than 0.09 micrometers, and wherein said first and second polymeric materials differ from each other in refractive index by at least about 0.03.

30. A mirror like polymeric article having at least first and second major surfaces, said article comprising a sufficient number of alternating layers of first and second polymeric materials such that at least 30% of light incident on said body is reflected, a substantial majority of the individual layers of said body having an optical thickness of not more than 0.09 micrometers or not less than 0.45 micrometers, with at least one of said individual layers having an optical thickness of not more than 0.09 micrometers, wherein said first and second polymeric materials differ from each other in refractive index by at least about 0.03, and wherein one of said major surfaces includes a light absorbent layer.

31. A mirror like polymeric article having at least first and second major surfaces, said article comprising a sufficient number of alternating layers of first and second polymeric materials such that at least 30% of light incident on said body is reflected, and at least one interior light absorbing layer, a substantial majority of the individual layers of said body having an optical thickness of not more than 0.09 micrometers or not less than 0.45 micrometers, with at least one of said individual layers having an optical thickness of not more than 0.09 micrometers, and wherein said first and second polymeric materials differ from each other in refractive index by at least about 0.03.

32. A birefringent light polarizer which reflects light anisotropically, comprising multiple layers of at least first and second diverse polymeric materials, a substantial majority of the individual layers of said polarizer having an optical thickness of not more than 0.09 micrometers or not less than 0.45 micrometers, with at least one of said individual layers having an optical thickness of not more than 0.09 micrometers, and wherein said first and second polymeric materials differ from each other in refractive index by at least about 0.03 in one plane of the polarizer.

33. The birefringent light polarizer of claim 32 in which the difference in refractive index between said first and second polymeric materials is caused by stretching said materials in a uniaxial direction to orient said polymeric materials.

* * * * *